United States Patent [19]

Otani et al.

[11] Patent Number: 5,374,848
[45] Date of Patent: Dec. 20, 1994

[54] THERMAL STRESS RESISTANT SEMICONDUCTOR DEVICE MOUNTING ARRANGEMENT

[75] Inventors: Hiroshi Otani; Yoshiharu Takahashi; Yasuhiro Murasawa, all of Itami; Tadashi Ichimasa, Kawanishi, all of Japan

[73] Assignee: Mitsubishi Denki Kabushiki Kaisha, Tokyo, Japan

[21] Appl. No.: 872,032

[22] Filed: Apr. 23, 1992

[30] Foreign Application Priority Data

Apr. 23, 1991 [JP] Japan .................................. 3-090903
Mar. 17, 1992 [JP] Japan .................................. 4-060538

[51] Int. Cl.$^5$ ........................................... H01L 23/02
[52] U.S. Cl. .................................... 257/685; 257/724; 361/760
[58] Field of Search ................... 257/685, 724, 723; 361/400, 403, 409, 772, 807, 808, 760, 767, 772, 777

[56] References Cited

U.S. PATENT DOCUMENTS 4,984,064 1/1991 Toshio et al. ..................... 257/724
5,055,912 10/1991 Murasawa et al. ................. 357/74

FOREIGN PATENT DOCUMENTS 0335123  3/1989  European Pat. Off. .
1304795 12/1989  Japan .
2035701  8/1979  United Kingdom .

*Primary Examiner*—Rolf Hille
*Assistant Examiner*—Roy Potter
*Attorney, Agent, or Firm*—Leydig, Voit & Mayer

[57] ABSTRACT

Cracks in solder connecting terminal leads of an IC to a circuit board are prevented by reducing the stress due to the difference in the coefficients of thermal expansion of a pair of IC packages mounted on opposite surfaces of a circuit board and the circuit board. In this invention, the position of an IC package mounted on the upper surface of a circuit board is spaced from the position of an IC package mounted on the lower surface of the circuit board. Alternatively, the IC packages are mounted on the upper and lower surfaces in directions which are substantially orthogonal. Alternatively, the IC packages are mounted such that the positions of lead portions of one of the upper IC packages are spaced from the positions of the lead portions of the other IC package by a distance which is at least 2.4 times the thickness of the circuit board.

6 Claims, 6 Drawing Sheets

—— STRESS GENERATED IN SOLDER PORTION 5

--- STRESS GENERATED IN SOLDER PORTION 6

THERMAL STRESS RESISTANT SEMICONDUCTOR DEVICE MOUNTING ARRANGEMENT

BACKGROUND OF THE INVENTION

1. Field of the Invention

The present invention relates to a so-called double-surface-packaged semiconductor device in which IC packages are mounted on two opposed surfaces of a circuit board.

2. Description of the Related Art

FIG. 14 is a cross-sectional view of a conventional semiconductor device of double-surface-mounted type. In FIG. 14, reference numeral 1 denotes a circuit board, and reference numerals 2 and 3 are IC packages. Each of the IC packages 2 and 3 is a surface-mounted type package which includes a rectangular package body 2a or 3a, and gull-wing shaped lead terminals 2b or 3b extending from opposite sides of the package body 2a or 3a. The circuit board 1 has mount pads 4 formed on each of the upper and lower surfaces thereof. The mount pads 4 are disposed on the upper and lower main surfaces at positions which are symmetrical with respect to the circuit board 1. The lead terminals 2b and 3b of the IC packages 2 and 3 are fixed to the mount pads 4 by solder 5 and 6, respectively.

When the IC packages 2 and 3 are to be mounted on both surfaces of the circuit board 1, the solder 5 is first placed on the mount pads 4 formed on the upper surface of the circuit board 1. Next, the lead terminals 2b of the IC package 2 are placed on the solder 5, and the solder 5 is heated and thereby melted, by which the mount pads 4 are electrically connected to the lead terminals 2b. Thereafter, the IC package 3 is mounted on the lower surface of the circuit board 1 in the same manner.

In the aforementioned conventional semiconductor device, since the IC packages 2 and 3 are mounted on upper and lower surfaces of the circuit board 1 at positions which are symmetrical with respect to the circuit board 1, the conventional semiconductor device has the following drawbacks.

When the IC packages 2 and 3 are mounted on the circuit board 1 or in a temperature cycle test which is performed after fabrication, since the coefficient of thermal expansion of the IC packages 2 and 3 is different from that of the circuit board 1 and the amount of deformation due no changes in the temperature thus differs between the IC packages 2 and 3 and the circuit board 1, a stress, such as tension or compression, is exerted on the solder 5 and 6 connecting the IC packages 2 and 3 and the circuit board 1. Consequently, cracks may occur in the solder 5 and 6, degrading the electrical characteristics of the semiconductor device.

SUMMARY OF THE INVENTION

Accordingly, an object of the present invention is to provide a semiconductor device effectively preventing cracking of the solder caused by changes in temperature.

In order to achieve the above object, according to one aspect of the present invention, there is provided a semiconductor device in which IC packages are mounted on two main surfaces of a circuit board, which comprises a circuit board having a pair of upper and lower main surfaces, a plurality of mount pads formed on each of the two main surfaces of the circuit board, each of the plurality of mount pads having a predetermined width, a plurality of IC packages each of which has a plurality of lead terminals at opposite sides thereof, each of the lead terminals having a lead portion fixed to a corresponding mount pad, and a connecting portion fixing the lead portions to the corresponding mount pad. The position of the mount pads on the lower main surface of the circuit board is different from the position of the mound pads on the upper main surface thereof by a distance corresponding to at least the width of the mount pads in a direction parallel to the main surfaces.

In a semiconductor device according to another aspect of the present invention, the IC packages are disposed on the upper and lower main surfaces of the circuit board in such a manner that they oppose each other with the circuit board therebetween and in such a manner that the lead terminals thereof are substantially perpendicular to each other.

In a semiconductor device according to another aspect of the present invention, when circuit boards having a thickness of 0.5 mm or less are used, the IC packages are disposed such that the lead portions of the lead terminals of the IC package mounted on the upper main surface of the circuit board are spaced from the lead portions of the lead terminals of the IC package mounted on the lower main surface thereof so as to oppose the IC package mounted on the upper main surface through the circuit board by 1.2 mm or more in a direction along (parallel to) the main surfaces.

In a semiconductor device according to another aspect of the present invention, the IC packages are mounted such that the lead portions of the IC package mounted on the upper surface of the circuit board are spaced from the lead portions of the IC package mounted on the lower surface by a distance corresponding to at least 2.4 times the thickness of the circuit board in a direction along the main surfaces.

In either aspect of the present invention, since the IC packages are mounted on the two main surfaces of the circuit board at positions which are spaced from each other, any difference in the deformation of the IC packages and the circuit board, caused by a difference in the coefficients of thermal expansion thereof, is absorbed by deformation of the circuit board, and the stress generated in the solder, which is the connecting portion between the IC package and the circuit board, is lessened, thus avoiding cracking in the solder.

DETAILED DESCRIPTION OF THE PREFERRED EMBODIMENTS

Embodiments of the present invention will now be described in detail with reference to the accompanying drawings.

Figure 1:
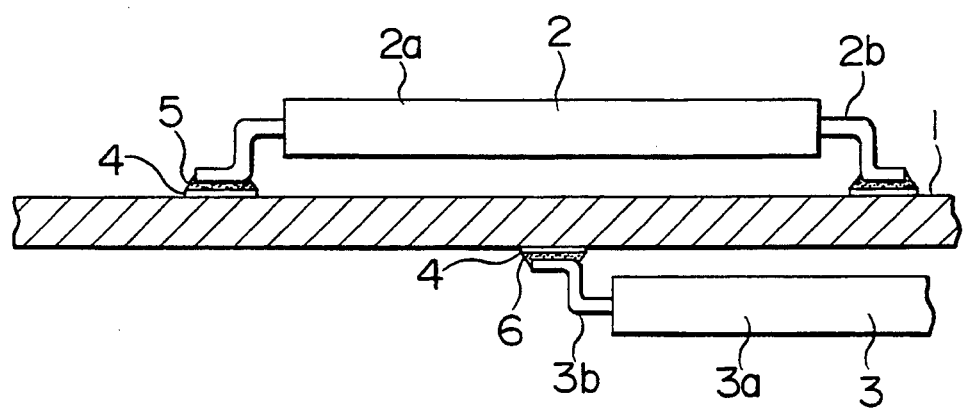
FIG. 1 is a cross-sectional view of a first embodiment of a semiconductor device according to the present invention.
Figure 14:
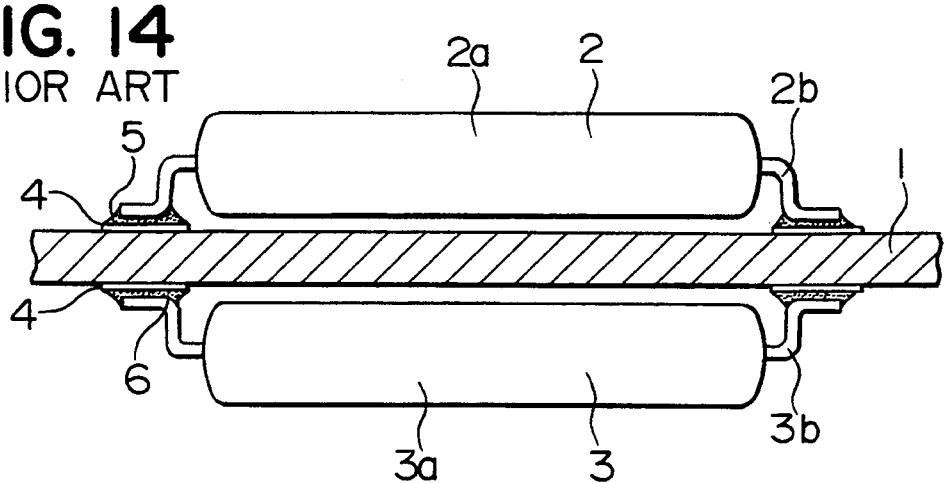
FIG. 14 is a cross-sectional view of a conventional semiconductor device.

FIG. 1 is a cross-sectional view of a first embodiment of a semiconductor device according to the present invention. Parts corresponding to those of the conventional semiconductor device shown in FIG. 14 are denoted by the same reference numerals. Reference numeral 1 denotes a circuit board, and reference numerals 2 and 3 are IC packages. Each of the IC packages 2 and 3 is a surface-mounted type package which includes a rectangular package body 2a or 3a, and gull wing-shaped lead terminals 2b or 3b extending from opposite sides of the package body 2a or 3a. The circuit board 1 has mount pads 4 on each of the upper and lower surfaces thereof.

In this embodiment, the position of the mount pads 4 on the upper main surface of the circuit board 1 deviates from the position of the mounted pads 4 on the lower main surface by a distance which is equal to or longer than the width of the mount pad 4 in a direction along the main surfaces, i.e., in a direction parallel to the main surfaces. The IC packages 2 and 3 are joined to the upper and lower mount pads 4 by the solder 5 and 6, respectively. In the semiconductor device arranged in the manner described above, the IC packages 2 and 3 are mounted by the same procedures as conventionally used. At that time, since the upper and lower mount pads 4 are located at positions which are offset from each other, thermal deformation of the circuit board 1 is not restricted by the IC packages 2 and 3, and the circuit board 1 can thus be deformed freely. Therefore, the residual stress in the solder is greatly reduced, and generation of cracks in the solder 5 and 6 is thus avoided.

Figure 2:
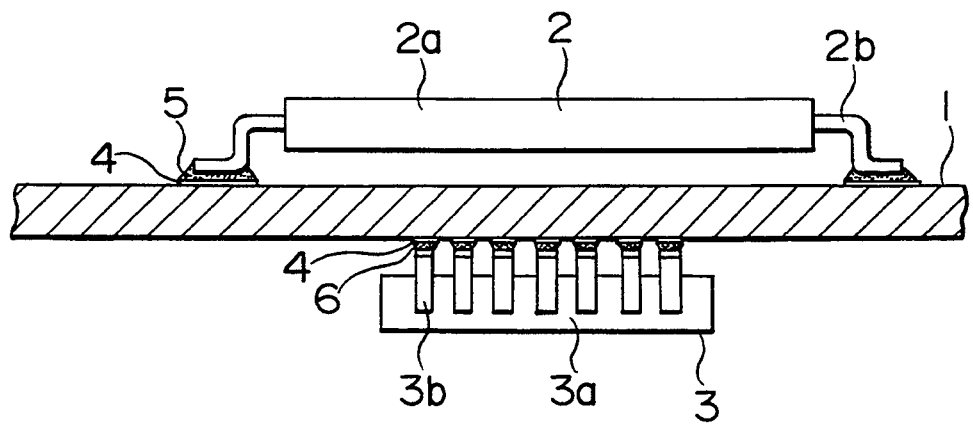
FIG. 2 is a cross-sectional view of a second embodiment of the semiconductor device according to the present invention.

FIG. 2 is a cross-sectional view of a second embodiment of a semiconductor device according to the present invention. Parts which are the same as or correspond to those shown in FIG. 1 are denoted by the same reference numerals.

In this embodiment, the mount pads 4 are disposed on the circuit board 1 so that the IC packages 2 and 3 are mounted on the upper and lower surfaces of the circuit board 1 orthogonally to each other, i.e., in directions so that the lead terminals 2b and 3b extend along directions that are perpendicular or substantially perpendicular to each other.

In this embodiment, since the mount pads 4 are located on the upper and lower surfaces of the circuit board 1 at positions which are offset from each other, cracking of the solder 5 and 6 due to changes in temperature can be avoided, as in the case of the first embodiment.

In the aforementioned two embodiments, DIP (Dual Inline Package) IC packages 2 and 3 have been described. However, the present invention can also be applied to FPT (Flat Package Type) IC packages.

Furthermore, in the above-described embodiments, the gull-wing shaped lead terminals 2b and 3b have been described. However, the present invention can also be applied to J-shaped lead terminals (see FIG. 6) and bud shaped lead terminals (see FIG. 7).

In a third embodiment, positional deviation between the IC packages mounted on the upper and lower surfaces of the circuit board 1 is numerically restricted based on the results of experiments.

Figure 3:
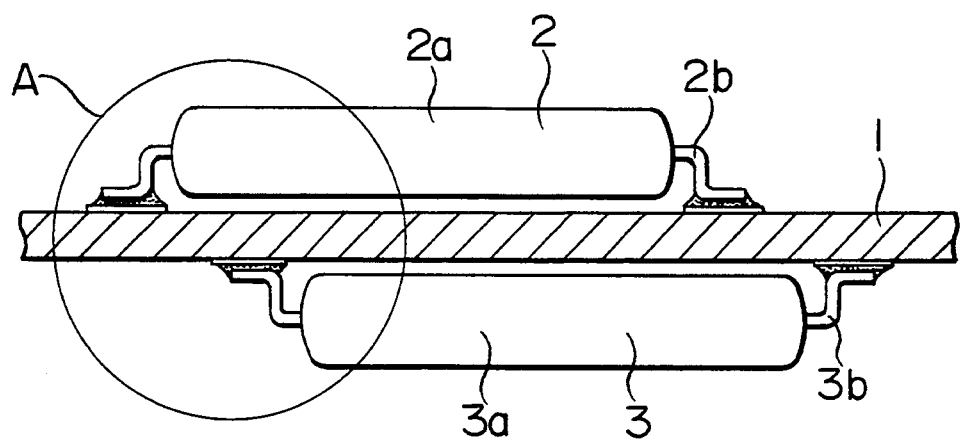
FIG. 3 is a cross-sectional view of a third embodiment of the semiconductor device according to the present invention.
Figure 4:
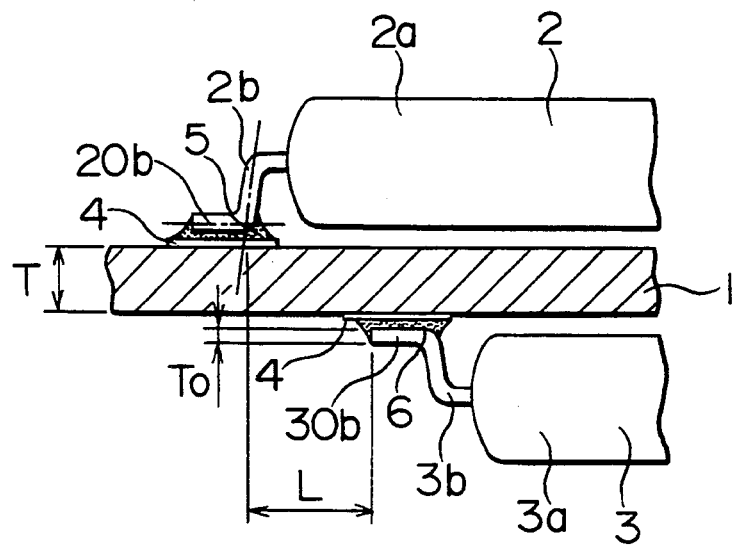
FIG. 4 is an enlarged cross-sectional view of portion A of FIG. 3.

FIG. 3 is a cross-sectional view of a third embodiment of a semiconductor device according to the present invention. FIG. 4 is an enlarged cross-sectional view of portion A shown in FIG. 3. Parts which are the same as or correspond to those in the aforementioned embodiments are denoted by the same reference numerals. In FIG. 4, lead portions 20b and 30b of the lead terminals 2b and 3b indicate portions which are joined to the mount pads 4 by the solder 5 and 6, respectively. T denotes a thickness of the circuit board 1. To indicates a thickness of each of the lead terminals 2b and 3b. L indicates the distance between the lead portion 20b of the lead terminal 2b of the IC package 2 mounted on the upper surface and the lead portion 30b of the lead terminal 3b of the IC package 3 mounted on the lower surface.

Figure 5:
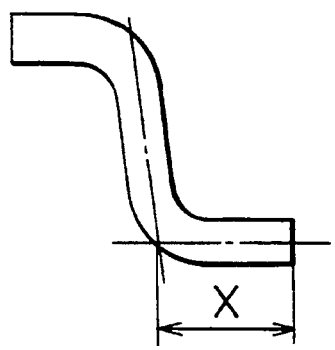
FIG. 5 is an enlarged view illustrating a lead portion of a gull-wing shaped lead terminal.
Figure 6:
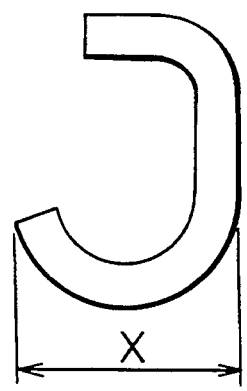
FIG. 6 is an enlarged view illustrating a lead portion of a J-shaped lead terminal.
Figure 7:
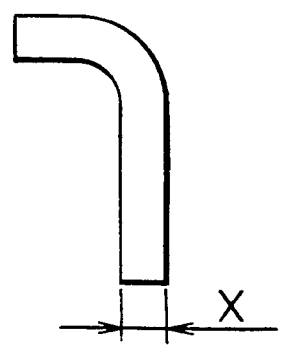
FIG. 7 is an enlarged view illustrating a lead portion of a bud-shaped lead terminal.

In FIGS. 5, 6 and 7, lead portions of various types of lead terminals which are defined by this invention are indicated by a mark X. In the gull-wing shaped lead terminal shown in FIG. 5, a portion between the forward end of the lead terminal and an intersection at a lower bent portion where medial lines of both portions cross each other is defined as lead portion X. In the J-shaped lead terminal shown in FIG. 6, the width of the entire lead terminal is defined as lead portion X. In the bud-shaped lead terminal shown in FIG. 7, the width of the lead is defined as lead portion X.

In this embodiment, the IC packages 2 and 3 are mounted on the upper and lower surfaces of the circuit board 1 such that the ends of the lead portions 20b and 30b of the lead terminals 2b and 3b are spaced from each other along a direction parallel to the surface of the circuit board 1 by a distance L which is at least 2.4 times the thickness T of the circuit board 1. Thus, the mount pads 4 are disposed on the circuit board 1 such that they satisfy the above-mentioned condition.

Figure 8:
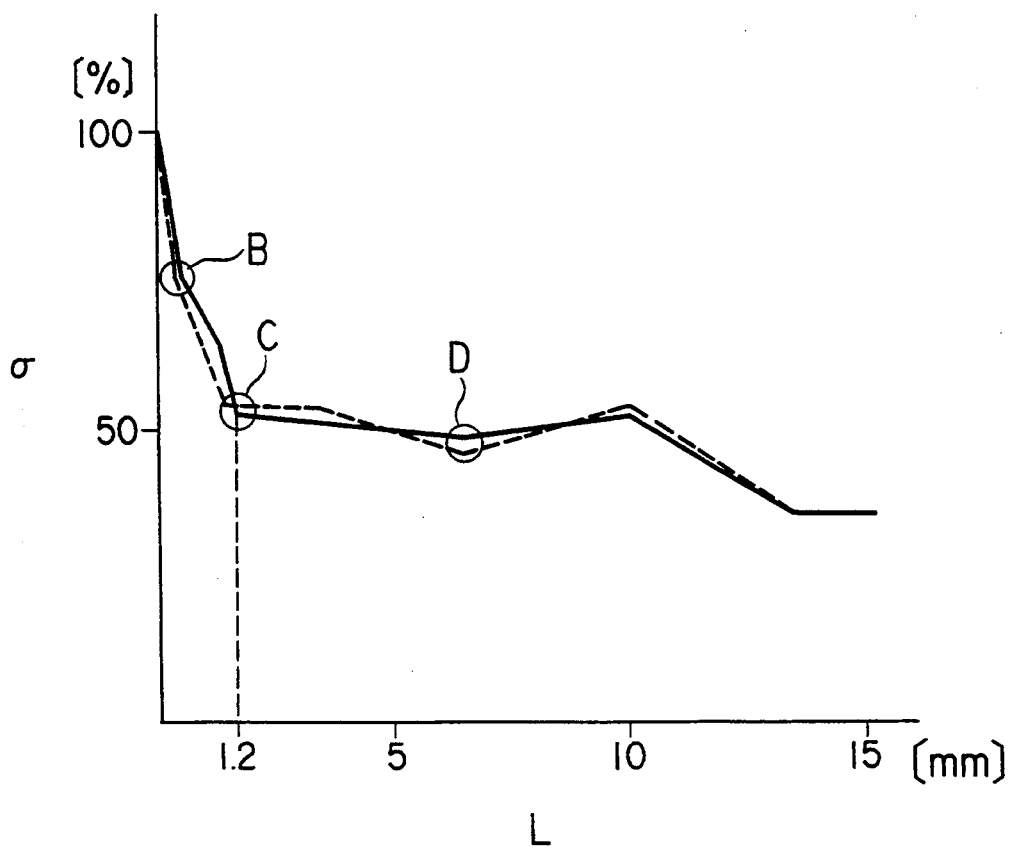
FIG. 8 illustrates the relationship between a distance L between the lead portions and a stress generation ratio σ of the solder.

FIG. 8 illustrates the relation between the space L between the lead portions and stress generation ratio σ, which is obtained from a computer structural analysis. The abscissa indicates the distance L between the lead portions (in a direction along the circuit board (parallel thereto), and the ordinate represents the stress generation ratio σ. Stress generation ratio σ is the proportion of the stress generated relative to the stress generated in the solder 5 and 6 when the IC packages are mounted on the upper and lower surfaces of the circuit board 1 at positions symmetrical with respect to the circuit board 1. The thickness T of the circuit board 1 is 0.5 mm. The thickness T0 of each of the lead terminals 2b and 3b is 0.125 mm. As can be seen from FIG. 8, when the space L is about 1.2 mm or more, the stress generated in the solder 5 and 6 is greatly reduced. Also, it has been confirmed that the same effect can be obtained in the actual temperature cycle test. Thus, the space L between the lead portions must be at least 2.4 times the thickness T of the circuit board 1.

Figure 9:
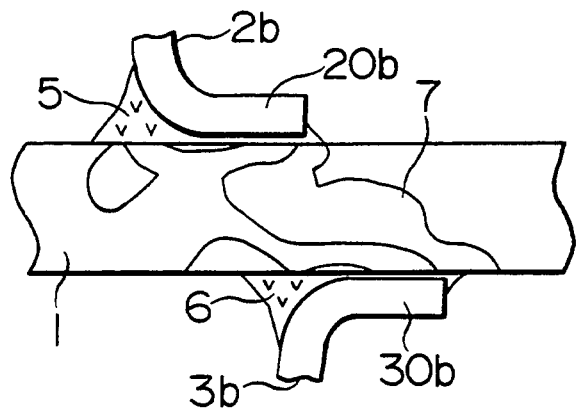
FIG. 9 illustrates distribution of stress in the circuit board at point B shown in FIG. 8.
Figure 10:
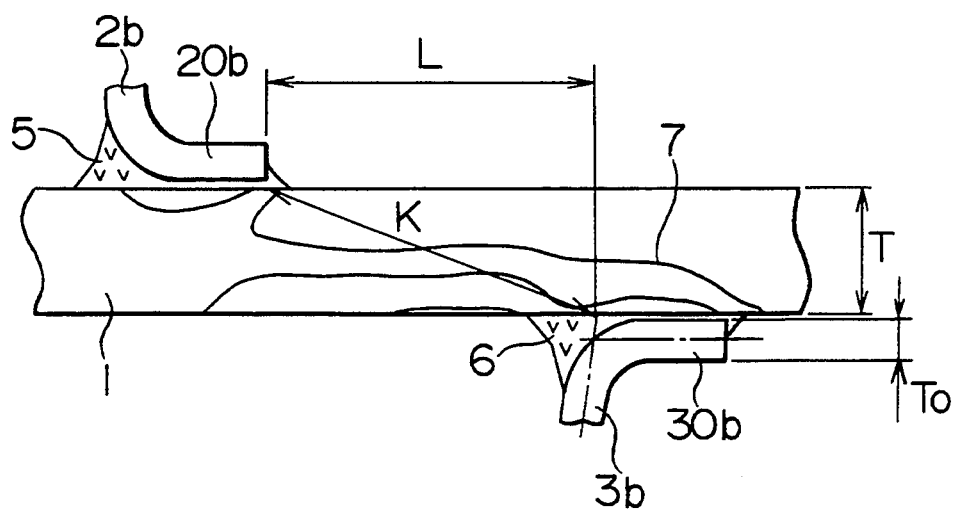
FIG. 10 illustrates distribution of stress in the circuit board at point C shown in FIG. 8.
Figure 11:
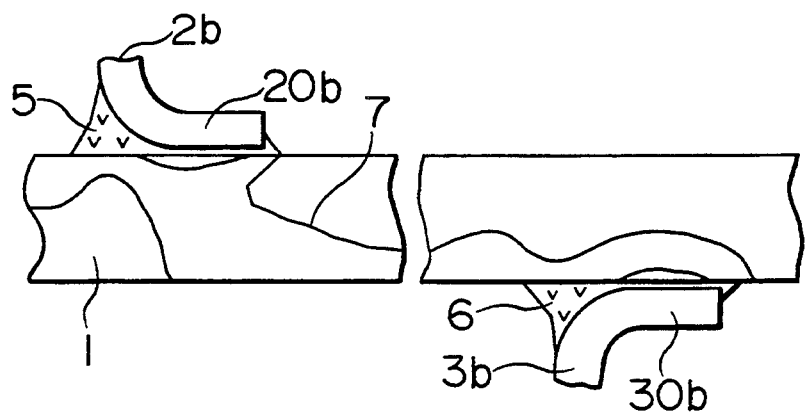
FIG. 11 illustrates distribution of stress in the printed board at point D shown in FIG. 8.

FIGS. 9, 10 and 11 illustrate the distribution of the generated stress at points B, C and D in the circuit board 1 shown in FIG. 8 using contours 7. A line K, as shown in FIG. 10, indicates the shortest distance between the lead portions on the upper and lower surfaces of the circuit board 1. In the state shown in FIG. 9 in which the space between the lead portions 20b and 30b is narrow, the stresses generated on the upper and lower surfaces of the circuit board 1 affect each other, and the stress generated in the solder 5 and 6 is thus increased.

In the state shown in FIG. 10 which illustrates the distribution of the generated stress at point C in FIG. 8, it can be seen that since the space L (=1.2 mm) between the upper and lower lead portions 20b and 30b is large, the solder 5 and 6 do not substantially affect each other. At point C, the space L (=1.2 mm) between the upper and lower lead portions is 2.4 times the thickness T (=0.5 mm) of the circuit board 1.

In the state shown in FIG. 11 which illustrates the distribution of the stress generated at point D shown in FIG. 8 at which the space L between the lead portions 20b and 30b of the upper and lower IC packages is larger than that at point C, the solder connections 5 and 6 do not substantially affect each other, as in the case shown in FIG. 10.

It can also be seen from FIGS. 9, 10 and 11 that, even when the space L between the lead portions 20b and 30b of the upper and lower IC packages is made larger than that at point C (L=1.2 mm), the effect remains the same, and that a space at point C (L=1.2 mm) is enough to ensure a reduction in the stress generated in the solder 5 and 6.

It can thus be seen that the space L between the lead portions 20b and 30b of the upper and lower IC packages must be at least 2.4 the thickness T of the circuit board 1.

Furthermore, since the mutual influence between the solder portions 5 and 6 depends on the spacing between the lead portions 20b and 30b of the upper and lower IC packages, the influence can be suppressed by increasing the shortest distance K between the lead portions 20b and 30b which includes the thickness T of the circuit board 1 shown in FIG. 10. That is, the amount of stress generated in the solder 5 and 6 can also be reduced by increasing the thickness T of the circuit board 1.

Therefore, in addition to the condition that the space L between the lead portions on the upper and lower surfaces is at least 2.4 times the thickness T of the circuit board, another condition is that the space L between the lead portions of the upper and lower IC packages is at least 1.2 mm when the circuit board has a thickness of no more than 0.5 mm. Furthermore, since the thickness T0 of the lead terminal (the lead portion) was 0.125 mm and the thickness T of the circuit board was 0.5 mm in the above experiments, a condition that the thickness T of the circuit board is no more than 4 times the thickness T0 of the lead terminal may be added to the above-mentioned two conditions.

Figure 12:
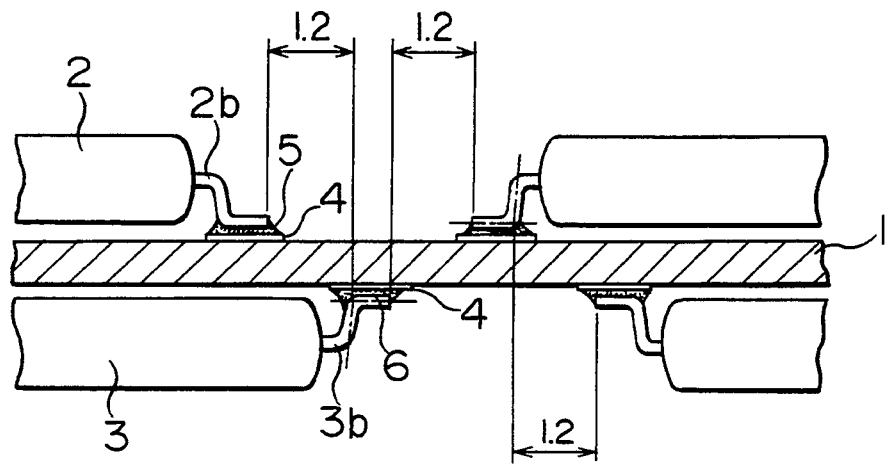
FIG. 12 is a cross-sectional view of a fourth embodiment of the semiconductor device according to the present invention in which a plurality of ICs are mounted on each of two surfaces of a circuit board.
Figure 13:
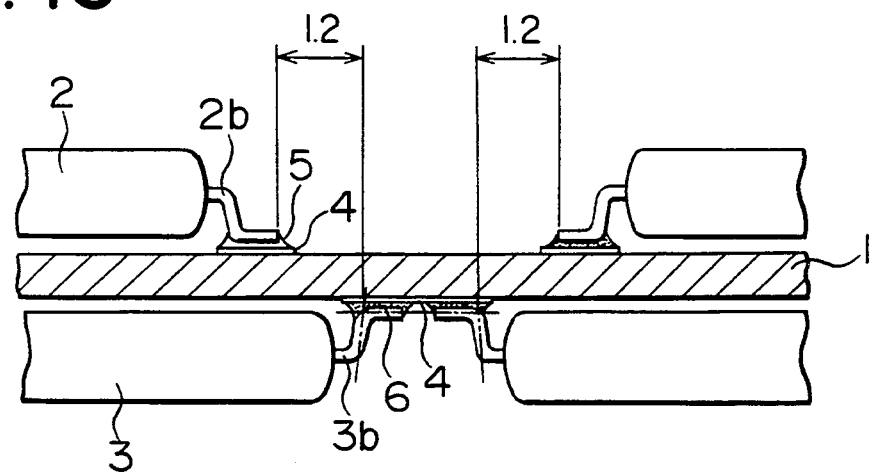
FIG. 13 is a cross-sectional view of a fifth embodiment of the semiconductor device according to the present invention in which a plurality of ICs are mounted on each of the two surfaces of the circuit board.

As shown in FIGS. 12 and 13, a plurality of IC packages 2 and 3 may be mounted on the upper and lower surfaces of the circuit board 1. The present invention can also be applied to such cases.

In this embodiment, the IC packages having the gull-wing shaped lead terminals have been described. However, the present invention can also be applied to IC packages having J-shaped or bud-shaped lead terminals or IC packages having a combination of J-shaped and bud-shaped lead terminals. In the cases of the J-shaped and bud-shaped lead terminals, the lead portions are defined by X as indicated in FIGS. 6 and 7, as mentioned above.

As will be understood from the foregoing description, in a semiconductor device according to the present invention, since the IC packages are mounted on the two opposed surfaces of the circuit board at positions which are spaced from each other, deformation of the circuit board is not restricted by the IC packages on the upper and lower surfaces, and the circuit board can thus be deformed freely. Consequently, the amount of stress generated in the solder 5 and 6 is reduced when compared with the deformation in the conventional device, and cracking of the solder is avoided.

What is claimed is:

1. A semiconductor device in which IC packages are mounted on two opposed main surfaces of a circuit board comprising:
    a circuit board having opposed upper and lower main surfaces;
    a plurality of mount pads located on each of the upper and lower main surfaces of said circuit board, each of said mount pads having a predetermined width;
    at least two IC packages, each IC package having two opposed sides and a plurality of lead terminals projecting from the two sides, each of said lead terminals having a lead portion fixed to a corresponding mount pad, at least one of said IC packages being mounted on each of the upper and lower main surfaces of said circuit board; and
    a connecting portion fixing each of said lead portions to a corresponding mount pad wherein each of the mount pads on the lower main surface of said circuit board is spaced from the mount pads on the upper main surface of said circuit board along a direction transverse to the two sides by a distance, measured parallel to the upper main surface, at least equal to the width of the mount pads.

2. A semiconductor device in which IC packages are mounted on two opposed main surfaces of a circuit board comprising:
    a circuit board having opposed upper and lower main surfaces;
    a plurality of mount pads located on each of the upper and lower main surfaces of said circuit board;
    at least two IC packages, each IC package having two opposed sides and a plurality of lead terminals projecting from the two sides, each of said lead terminals having a lead portion fixed to a corresponding mount pad, at least one of said IC packages being mounted on each of the upper and lower main surfaces of said circuit board; and
    a connecting portion fixing each of said lead portions to a corresponding mount pad, wherein said plurality of mount pads are arranged on the upper and lower main surfaces of said circuit board such that said IC packages mounted on the upper and lower main surfaces of said circuit board are substantially orthogonal to each other.

3. A semiconductor device in which IC packages are mounted on two opposed main surfaces of a circuit board comprising:
 a circuit board having opposed upper and lower main surfaces and a thickness of no more than 0.5 mm;
 a plurality of mount pads located on each of the upper and lower main surfaces of said circuit board;
 at least two IC packages, each IC package having two opposed sides and a plurality of lead terminals projecting from the two sides, each of said lead terminals having a thickness and a lead portion fixed to a corresponding mount pad, at least one of said IC packages being mounted on each of the upper and lower main surfaces of said circuit board; and
 a connecting portion fixing each of said lead portions to the corresponding mount pad, wherein said plurality of mount pads are arranged on the upper and lower main surfaces of said circuit board such that the lead portions of the lead terminals of the IC package mounted on the upper main surface are spaced from the lead portions of the lead terminals of the IC package mounted on the lower main surface by at least 1.2 mm measured along a direction parallel to the upper main surface.

4. A semiconductor device according to claim 3 wherein the thickness of said circuit board is no more than 4 times the thickness of the lead terminals of the IC package.

5. A semiconductor device in which IC packages are mounted on two opposed main surfaces of a circuit board comprising:
 a circuit board having opposed upper and lower main surfaces and a thickness;
 a plurality of mount pads located on each of the upper and lower main surfaces of said circuit board;
 at least two IC packages, each IC package having two opposed sides and a plurality of lead terminals projecting from the two sides, each of said lead terminals having a thickness and a lead portion fixed to a corresponding mount pad, at least one of said IC packages being mounted on each of the upper and lower main surfaces of said circuit board; and
 a connecting portion fixing each of said lead portions to a corresponding mount pad wherein said plurality of mount pads are arranged on the upper and lower main surfaces of said circuit board such that the lead portions of the lead terminals of the IC package mounted on the upper main surface of said circuit board are spaced from corresponding lead portions of the lead terminals of the IC package mounted on the lower main surface of said circuit board along a direction transverse to the two sides by a distance at least 2.4 times the thickness of said circuit board.

6. A semiconductor device according to claim 5 wherein the thickness of said circuit board is no more than 4 times the thickness of the lead terminals of the IC packages.

* * * * *